United States Patent
Gregorius et al.

(10) Patent No.: US 7,154,809 B2
(45) Date of Patent: Dec. 26, 2006

(54) METHOD FOR MEASURING THE DELAY TIME OF A SIGNAL LINE

(75) Inventors: Peter Gregorius, Munich (DE); Paul Georg Lindt, Donauworth (DE); Heinz Ludwig Mattes, Munich (DE)

(73) Assignee: Infineon Technologies AG, Munich (DE)

( * ) Notice: Subject to any disclaimer, the term of this patent is extended or adjusted under 35 U.S.C. 154(b) by 94 days.

(21) Appl. No.: 10/808,143

(22) Filed: Mar. 24, 2004

(65) Prior Publication Data

US 2004/0210414 A1    Oct. 21, 2004

Related U.S. Application Data

(60) Provisional application No. 60/457,634, filed on Mar. 26, 2003.

(51) Int. Cl.
*G11C 8/00* (2006.01)

(52) U.S. Cl. ............... 365/233; 365/194; 375/356; 713/400

(58) Field of Classification Search ........... 365/233, 365/194; 375/356, 376; 327/149, 158; 713/400, 713/401

See application file for complete search history.

(56) References Cited

U.S. PATENT DOCUMENTS

| 5,852,640 | A  | * | 12/1998 | Kliza et al. ............. 375/356 |
| 6,456,544 | B1 | * | 9/2002 | Zumkehr ................ 365/193 |
| 6,724,685 | B1 | * | 4/2004 | Braun et al. ........... 365/233 |
| 2003/0014680 | A1 | * | 1/2003 | Zielbauer ............. 713/400 |

* cited by examiner

*Primary Examiner*—VanThu Nguyen
(74) *Attorney, Agent, or Firm*—Jenkins, Wilson, Taylor & Hunt, P.A.

(57) ABSTRACT

A memory buffer for a memory module board which is connected via a signal line (10-*i*) to a plurality of memory modules (2-*i*) mounted on said memory module board having different signal line lengths, wherein the memory buffer (1) comprises for each signal line (10-*i*) a corresponding integration circuit (18-*i*) for integrating the transmission time of a measurement pulse transmitted via said signal line (10-*i*) between said memory buffer (1) and a memory module (2-*i*) connected to said signal line (10-*i*).

11 Claims, 12 Drawing Sheets

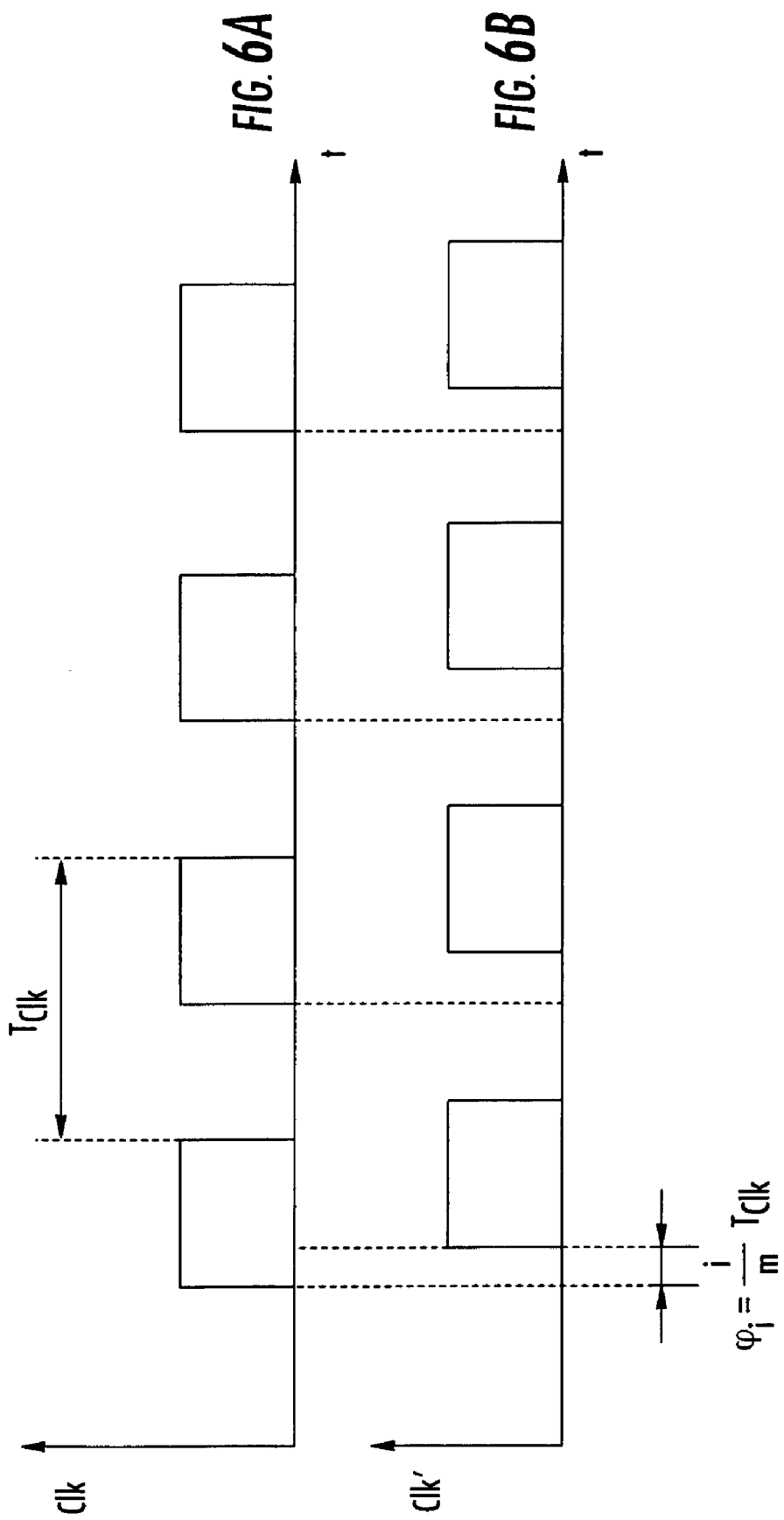

METHOD FOR MEASURING THE DELAY TIME OF A SIGNAL LINE

RELATED APPLICATIONS

This application claims the benefit of U.S. Provisional Patent Application Ser. No. 60/457,634, filed Mar. 26, 2003, the disclosure of which is incorporated herein by reference in its entirety.

TECHNICAL FIELD

Memory modules, referred to as DIMM (Dual in-line memory modules), have a defined physical extent. Owing to the finite speed of propagation of electrical signal, the physical extent of the DIMM thus corresponds to a delay time for the electrical signal in order to pass from a source to a sink. This phenomenon is generally referred to as the "line effect", that is to say the "electrical length" of the interconnects is no longer negligible. This is the situation when the highest frequency component which occurs in the signal is at a wavelength which is of the same order of magnitude as the physical extent between the source and the sink.

BACKGROUND ART

The higher the data rate on a DIMM, the higher are the frequencies of the frequency components and the shorter are the physical extents for which this line effect must be taken into account. Present memory developments use data rates which lead to major time-critical problems as a result of the subject under discussion. These present memory module developments have the particular characteristic feature of a central integrated circuit (IC) which is mounted on each DIMM. This integrated circuit (IC) is a memory buffer and produces the electrical signals for communication with the memory modules $MM_i$ locally, that is to say on the DIMM.

The Dual in-line memory module (DIMM) comprises a plurality of memory modules (MM) which are formed by DRAM-memory chips mounted on a DIMM circuit board. The DRAM-chips are connected to a memory buffer (HUB) located at the center of the DIMM circuit board. The DRAM-memory modules $MM_i$ are connected to the memory buffer by means of the command and address bus (CA) and point to point by a bi-directional data bus (DQ/DS). The data bus comprises for instance 72 parallel data lines. The memory bus is provided for the communication to the micro-controller mounted on a motherboard. The memory buffer is connected to a micro-controller via for instance 12 data lines. The memory buffer performs a parallel/serial data conversion or serial/parallel data conversion for data to be exchanged between DRAM-chips provided on said DIMM module and the motherboard.

The basic DIMM-structure according to the state of the art is shown in FIG. 1. As can be seen, a number of different signals are indicated there, which are either of different length (DQ/DQS) or else are received simultaneously by a large number of memory modules ($MM_i$) over a command and address bus (CA).

Read access to the memory modules $MM_i$ of a DIMM is not the only factor affected by this, but is particularly critical. Read access is distinguished by a command being transmitted via the CA bus (Command and Address Bus) to the individual memory modules $MM_i$. This memory modules $MM_i$ are formed e.g. by DRAM-integrated circuits. As can be seen without any difficulty, MM4 and MM5 are located closer to the data source (HUB) than the modules MMØ and MM8. It should thus be expected that the read command will reach the memory modules MM4 and MM5 considerably earlier than MMØ and MM8.

The timing diagram shown in FIG. 2 provides an illustration in the form of a graph to this relationship for the MM4 and MMØ.

At time t1, the source (HUB), i.e. the memory buffer, sends the read command via the uni-directional (CA-Bus) to the memory modules $MM_i$. At time t2, this command reaches the memory module MM4. However, since this command is addressed to all the memory modules $MM_i$, a further delay time is required before the final memory module MMØ receives the read command at the time t3. After receiving a read command, a dead time passes before the memory modules $MM_i$ start to transmit the data. Since all the memory modules $MM_i$ are identical, this dead time is also identical for MMØ and MM4. The dead time T4 at memory module MM4 ends at time t4, and the dead time $t_0$ at the time t6. The memory module MMØ at the distal end of the DIMM waits for the longest dead time $T_\emptyset$ to ensure that the all data of the remaining memory modules $MM_i$ will reach the memory buffer in time. At these times t4, t6 the memory modules (DRAM) start to transmit the required read data. The response from memory module MM4 reaches the memory buffer at the time t5, but the response from the memory module MMØ does not reach the receiving memory buffer until the time t7. FIG. 2 shows particularly clearly that a read command which is sent at a specific time t1 leads to a considerable time shift $\Delta T$ in the responses (times t5 and t7). If the data rate DR is sufficiently low, that is to say the duration of a single information bit is long in comparison to the time difference $\Delta T$ between t5 and t7, then there is no need to take these effects in account. Owing to the ever wider bandwidth required for memory media, this limit is, however, now considerably exceeded.

With increasing data rates DR on the data lines the wave length $\lambda$ of the data signal is diminished. When the wave length $\lambda$ reaches the dimension L of a data line dynamic effects on the data line have to be taken into account. The inductance of the line cause skin effect and the high frequency signal is distorted. Consequently dynamic effects cause dynamic time delay variations. These time delay variations have to be compensated to achieve a synchron interface between the DIMM modules and the motherboard.

A method for compensating for different delay times according to the state of the art is to route the interconnects in a meandering shape on the printed circuit board (PCB). However, this conventional method is quite unsuitable for this application. Firstly, the meanders require additional space on the DIMM-PCB, and this is very short. However, a far more serious disadvantage is the fact that the signals do not just have one transmitter and one receiver, but that a number of receivers should be addressed at the same time. This is completely impossible using simple methods since each signal would need to exist two or more times. A signal x which has to be passed from the source to all the memory modules $MM_i$ has to exist in versions x0 to x8. Each of these nine signals must then either have no meander at all (for example x0 to MMØ) or has a very large number of meanders (for example x4 to MM4). If the meandering interconnect routing requires additional space, then the additionally required multiplication of each signal leads to insoluble routing problems. Delay time compensation based on the known meandering routing is therefore impossible on a DIMM.

SUMMARY OF THE INVENTION

Accordingly it is the object of the present invention to provide a method and a memory bus for measuring exactly a delay time of a signal line caused by dynamic effects, i.e. when the wave length of the transmitted signal approximates the length of the signal line.

The invention provides a method for measuring the delay time of at least one signal line connecting a memory buffer with a memory module comprising the following steps:

(a) sending a measurement start command from said memory buffer to said memory module and simultaneously starting an integration circuit provided within said memory buffer;
(b) transmitting a measurement pulse via said signal line;
(c) stopping the integration circuit when the measurement pulse transmitted via the signal line is detected by a pulse detector provided within said memory buffer,
    wherein the integrated value of the integration circuit indicates the delay time of said signal line.

In a first embodiment a measurement pulse generator provided within said memory module is activated after reception of the measurement start command by said memory module to transmit a measurement pulse via a signal line to said memory buffer.

In a second embodiment a measurement pulse generator provided within said memory buffer is activated simultaneously with the integration circuit and the measurement start command is sent to said memory module to transmit a measurement pulse via said signal line to said memory module.

In this second embodiment the memory module preferably retransmits the measurement pulse received via said signal line back to the memory buffer when the memory module has received the measurement start command.

In a preferred embodiment the measurement start command is sent from said memory buffer to said memory module (MM) via a control word of a command and address bus (CA).

In a preferred embodiment the measurement pulse generator is clocked by a clock signal (CLK) having a predetermined clock period (T).

In a preferred embodiment the integration circuit is supplied with a phase adjusted clock signal (CLK') to integrate fractions ($T_{CLK}/m$) of the clock period ($T_{CLK}$) of said clock signal (CLK) to the delay time of said signal line.

In a preferred embodiment the clock signal (CLK) is generated by a clock signal generator.

In a preferred embodiment the measured delay time of said signal line is stored in a signal line delay memory provided within said memory buffer.

In a preferred embodiment a delay time compensation unit which is provided within said memory buffer is adjusted depending on the delay time which is stored in said signal line delay memory such that all signal lines connecting said memory buffer to different memory modules comprise an equal standard time delay.

In a preferred embodiment the signal line is the data line of a bi-directional data bus.

In a preferred embodiment the measurement start command is generated by a control logic of said memory buffer.

The invention further provides a memory buffer for a memory module board which is connected via signal lines to a plurality of memory modules (MM) mounted on said memory module board having different signal line lengths, wherein the memory buffer comprises for each signal line a corresponding integration circuit for integrating the transmission time of a measurement pulse transmitted via said signal line between said memory buffer and a memory module connected to said data line.

In a preferred embodiment of the memory buffer according to the present invention the memory buffer comprises a control logic which sends a measurement start command to memory modules via a control line of a command and address bus (CA).

In a preferred embodiment the signal line is a data line of a bi-directional data bus.

In a preferred embodiment of the memory buffer according to the present invention each integration circuit is connected to the control logic to receive a start signal when the measurement start command is sent to the memory modules.

In a preferred embodiment the memory buffer comprises a measurement pulse detector which detects a measurement pulse received via said signal lines.

In a preferred embodiment the integration circuit of the signal line is connected to a corresponding measurement pulse detector of said signal line to receive a stop signal when a measurement pulse is detected by said pulse detector.

In a preferred embodiment the memory buffer comprises a signal line delay memory for storing the integrated values of all integration circuits provided within said memory buffer as delay times of the corresponding signal lines.

In a preferred embodiment the memory buffer further comprises a delay compensation unit which compensates the delay times of the signal lines depending on the delay times stored in said signal line delay memory to provide an equal standard time delay for all signal lines of said memory buffer.

In a preferred embodiment the integration circuits are supplied with a phase adjusted clock signal (CLK') generated by a clock phase generator to integrate fractions of a clock period ($T_{CLK}$) of a clock signal (CLK) generated by a clocks signal generator provided within said memory buffer.

In a preferred embodiment the memory buffer comprises a measurement pulse generator which transmits a measurement pulse via the signal lines when the control logic sends a measurement start command to the memory modules.

In a preferred embodiment the delay compensation unit is connected via signal lines to a micro-controller mounted on a motherboard.

In a preferred embodiment the memory modules (MM) are DRAMs.

In the following preferred embodiments of the method for measuring the delay time and the memory buffer according to the present invention are described with reference of the enclosed figures.

BRIEF DESCRIPTION OF THE DRAWINGS

FIG. 6 shows a timing diagram of a phase adjusted clock signal according to the present invention;

DETAILED DESCRIPTION OF THE INVENTION

Figure 1:
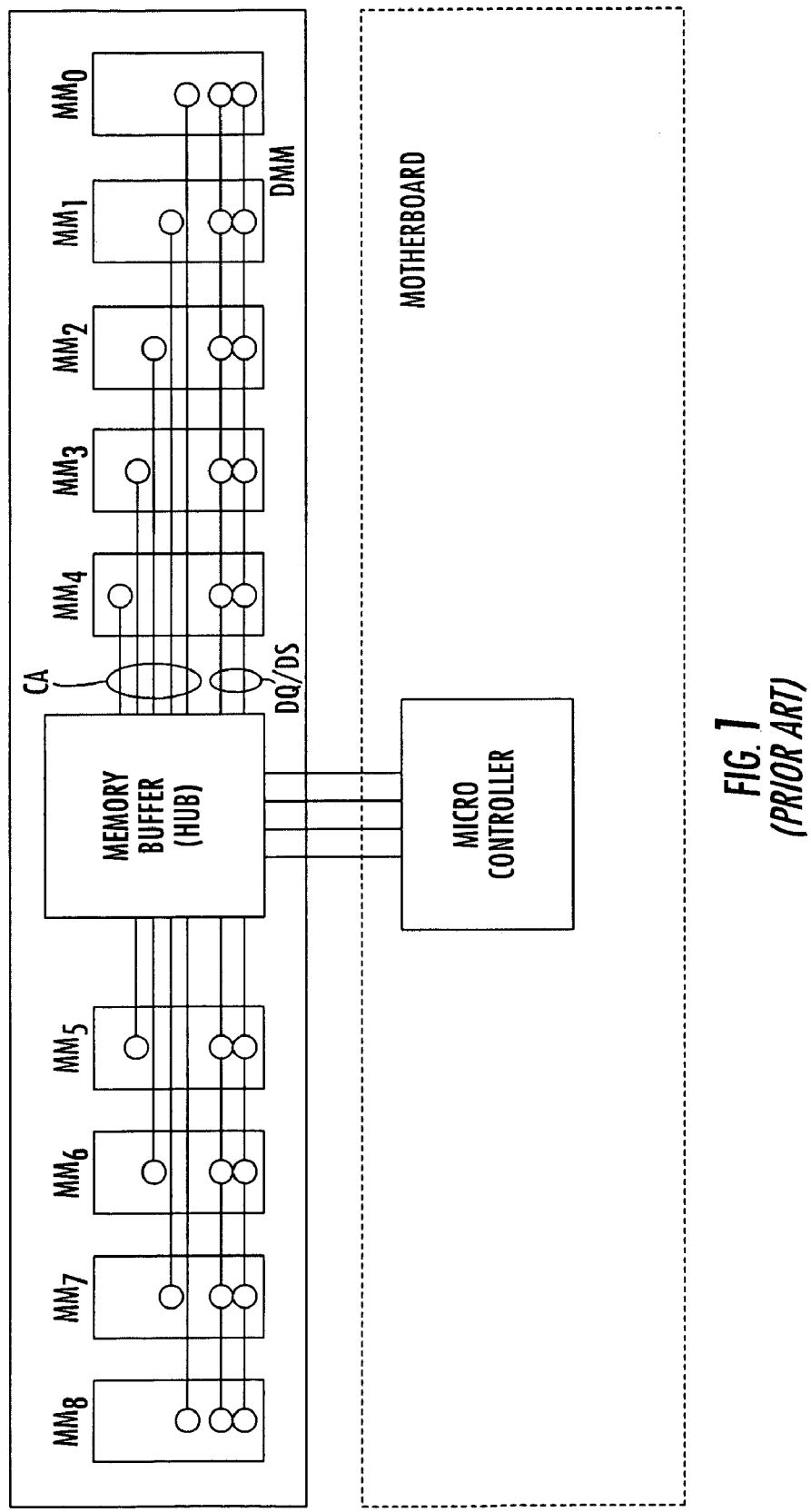
FIG. 1 shows a Dual in-line memory module (DIMM) according to the state of the art.
Figure 2:
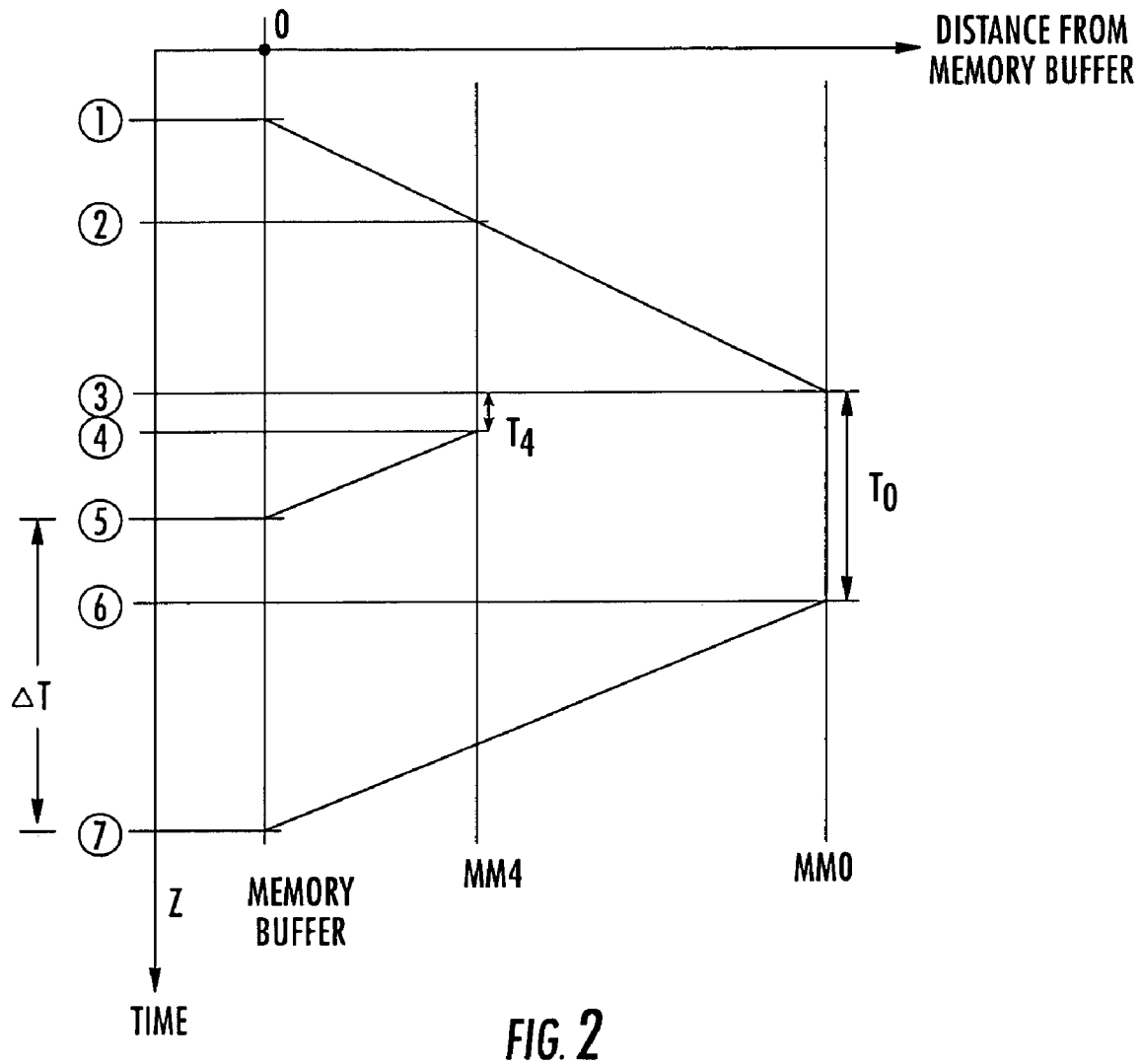
FIG. 2 shows a timing diagram of a data read operation in the conventional Dual in-line memory according to the state of the art as shown in FIG. 1.
Figure 3:
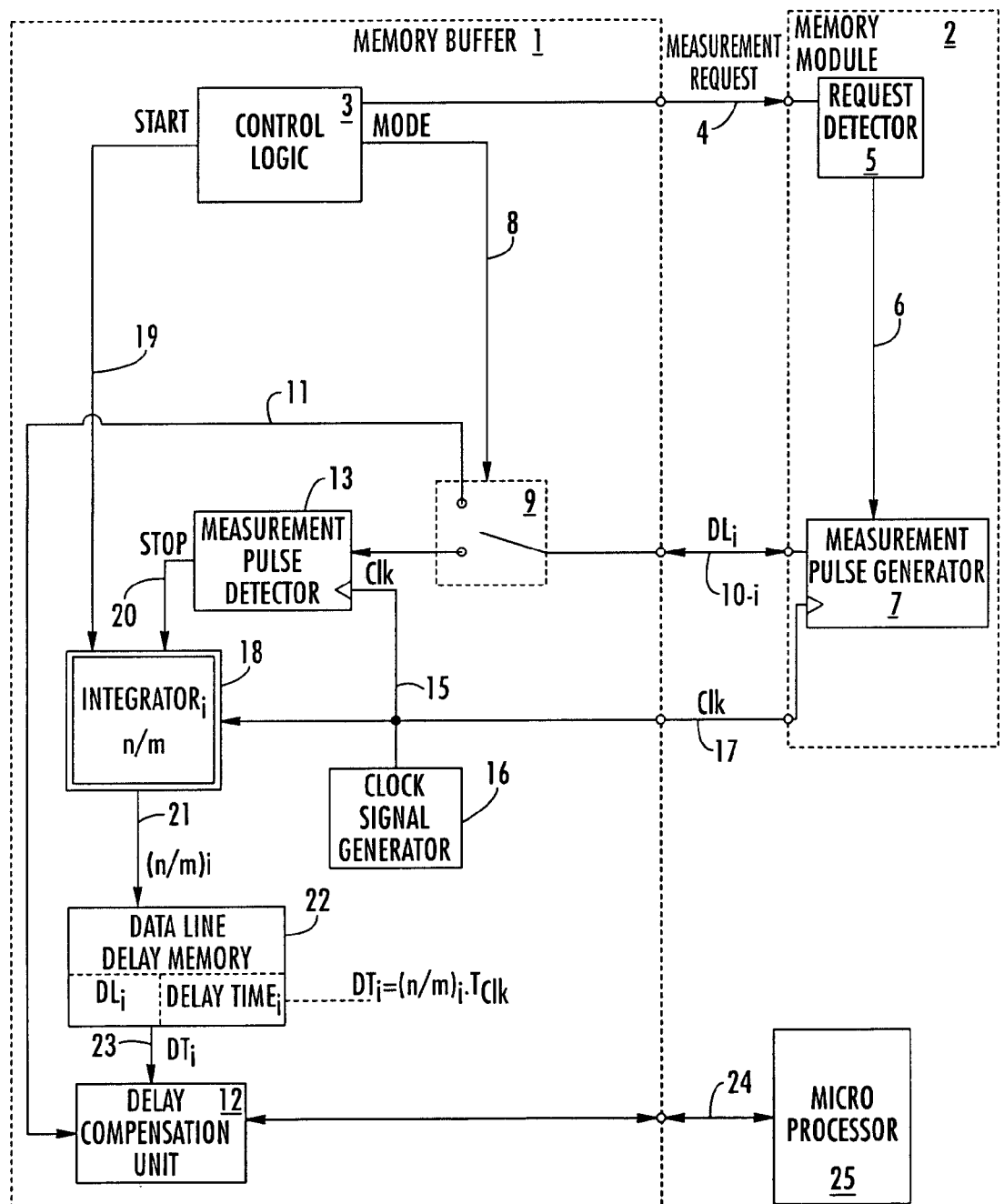
FIG. 3 shows a first embodiment of the memory buffer according to the present invention.

As can be seen from FIG. 3 the memory buffer 1 according to the present invention which is mounted on a DIMM module board is connected to several memory modules 2 such as DRAMs on the same DIMM board. The memory buffer 1 comprises a control logic 3 which generates a measurement start command to initiate a delay time measurement for a data line 10-$i$. The measurement start command is sent via a control line 4 of a command and address bus (CA) to the memory modules 2. This measurement request is detected by a request detector 5 within the memory module 2 which actuates via line 6 a measurement pulse generator 7 within the memory module 2.

The control logic 3 is further connected via control line 8 to a switch 9 which connects in a normal operation mode the data line 10-$i$ via an internal line 11 to a delay compensation unit 12 of the memory buffer 1. During an initialization routine the switch 9 is switched by the control logic 3 to the input of a measurement pulse detector 13 to detect a measurement pulse transmitted via the data lines 10. The measurement pulse detector 13 is provided to detect a pulse generated by the measurement pulse generator 7 within the memory module 2 of the Dual in-line memory (DIMM).

The measurement pulse detector 13 as clocked by a clock signal CLK via an internal clock line 15 of the memory buffer 1. The clock signal CLK is generated in a preferred embodiment by an internal clock signal generator 16 of said memory buffer 1. The clock signal CLK is supplied via a clock line 17 to the measurement pulse detector 7 of the memory module 2. The signal line 10 is a data line of a bi-directional data bus of the DIMM module.

The clock frequencies of the clock signal CLK generated by the clock signal generator 16 provided to measure the delay time of the signal line 10 correspond to the high data rates DR during the normal operation mode of the memory buffer 1. The data rates on the DIMM, i.e. on the data lines connecting the memory modules 2-$i$ to the memory buffer 1 are in the range of 800 Mbit/sec. Because of the high frequencies dynamic effects on the data lines 10-$i$ have to be considered so that the performed measurement must be very exact allowing the measurement of time fractions of the time period T of the generated clock signal CLK.

To this purpose the memory buffer 1 according to the present invention comprises in a preferred embodiment for each data line 10-$i$ a corresponding integration circuit 18-$i$. The integration circuit 18-$i$ is provided for integrating the transmission time of a measurement pulse transmitted via the signal line 10-1 between the memory module 2 and the memory buffer 1. A control logic 3 sends a start signal via a control line 19-$i$ to the integration circuit 18-$i$ when the control logic 3 sends the measurement start command via the control line 4 to the memory modules 2. The start signal received by the integration circuit 18-$i$ starts the integration procedure. The memory module 2 which receives the measurement request activates its measurement pulse generator 7 which transmits the measurement pulse via the data line 10-$i$ and the switch 9-$i$ connected to the input of the measurement pulse detector 13-$i$. The measurement pulse detector 13-$i$ sends a stop signal to the integration circuit 18-$i$ via a control line 20-$i$ when it detects the measurement pulse generated by the measurement pulse generator 7. The stop signal stops the integration procedure within the integration circuit 18-$i$. The integration circuit 18-$i$ integrates fractions of the clock period ($T_{CLK}$) of the clock signal (CLK) generated by said clock signal generator 16 provided within said memory buffer 1. The integration circuit 18-$i$ measures the delay time $DT_i$ of the data line 10-$i$ which is given by:

$$DT_i = (n/m)_i \cdot T_{CLK}$$

An integrated delay time of data line 10-$i$ is output by the integration circuit 18-$i$ via a line 21-$i$ and stored in a signal line delay memory 22 of the memory buffer 1. The signal delay memory 22 is connected to the delay compensation unit 12 via lines 23. After the measuring procedure has been accomplished the delay time compensation unit 12 is adjusted depending on the delay time $DT_i$ which is stored in the signal line delay memory 22 so that all signal lines 10-$i$ connecting the memory buffer 1 to the different memory modules 2-$i$ have the same standard time delay. The delay compensation unit 12 of the memory buffer 1 is connected via lines 24 to a microprocessor 25 on a separate motherboard. The data exchange between the delay compensation unit 12 and the microprocessor is performed with a very high data rate of e.g. 4.8 Gbit/sec. The delay compensation unit 12 compensates delay time variations of the different data lines 10-$i$ caused by dynamic effects. By compensating the delay times the asynchron physical interface between the microprocessors 25 and the memory module 2-$i$ becomes a synchron interface, i.e. from the point of view of the microprocessor 25 all memory modules 2-$i$ of the DIMM provide data requested by the microprocessor 25 synchronically.

Figure 4:
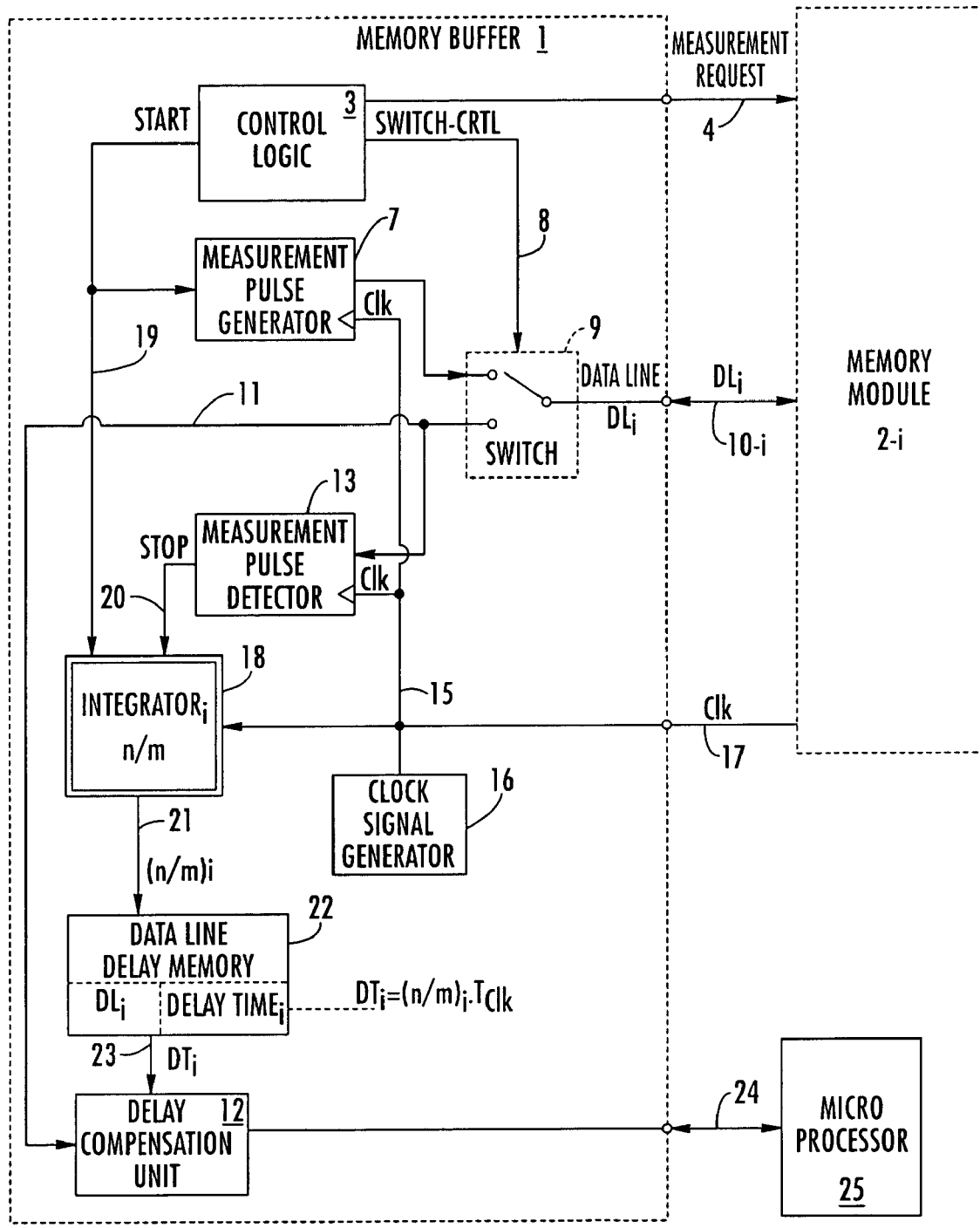
FIG. 4 shows a second embodiment of the memory buffer according to the present invention.

FIG. 4 shows a second embodiment of the memory buffer 1 according to the present invention. In this embodiment the measurement pulse generator 7 is provided within the memory buffer 1 and not within the respective memory module 2-$i$. In the second embodiment as shown in FIG. 4 the measurement pulse generator 7 provided within the memory buffer 1 is activated simultaneously within the integration circuit 18-$i$ when the measurement start command is sent by said control logic 3 via a control line 4 to the respective memory module 2-$i$. The measurement pulse generator 7 is activated to transmit a measurement pulse via the signal lines 10-$i$ to the memory module 2-$i$. The control logic 3 transmits in the measurement mode the measurement pulse 7 via switch 9 to the signal line 10-$i$. After the pulse generator 7 has transmitted the measurement pulse via line 10-$i$ to the memory module 2 switch 9 is switched by the control logic 3 to connect the input of the measurement pulse detector 13 to the data line 10-$i$. The memory module 2-$i$ retransmits the measurement pulse received via signal line 10-$i$ back to the memory buffer 1 when the memory module 2 has received the measurement start command via the control line 4. After the measurement pulse detector 13 has received the retransmitted measurement pulse it stops the integration circuit 18 via the internal control line 20.

Figure 5:
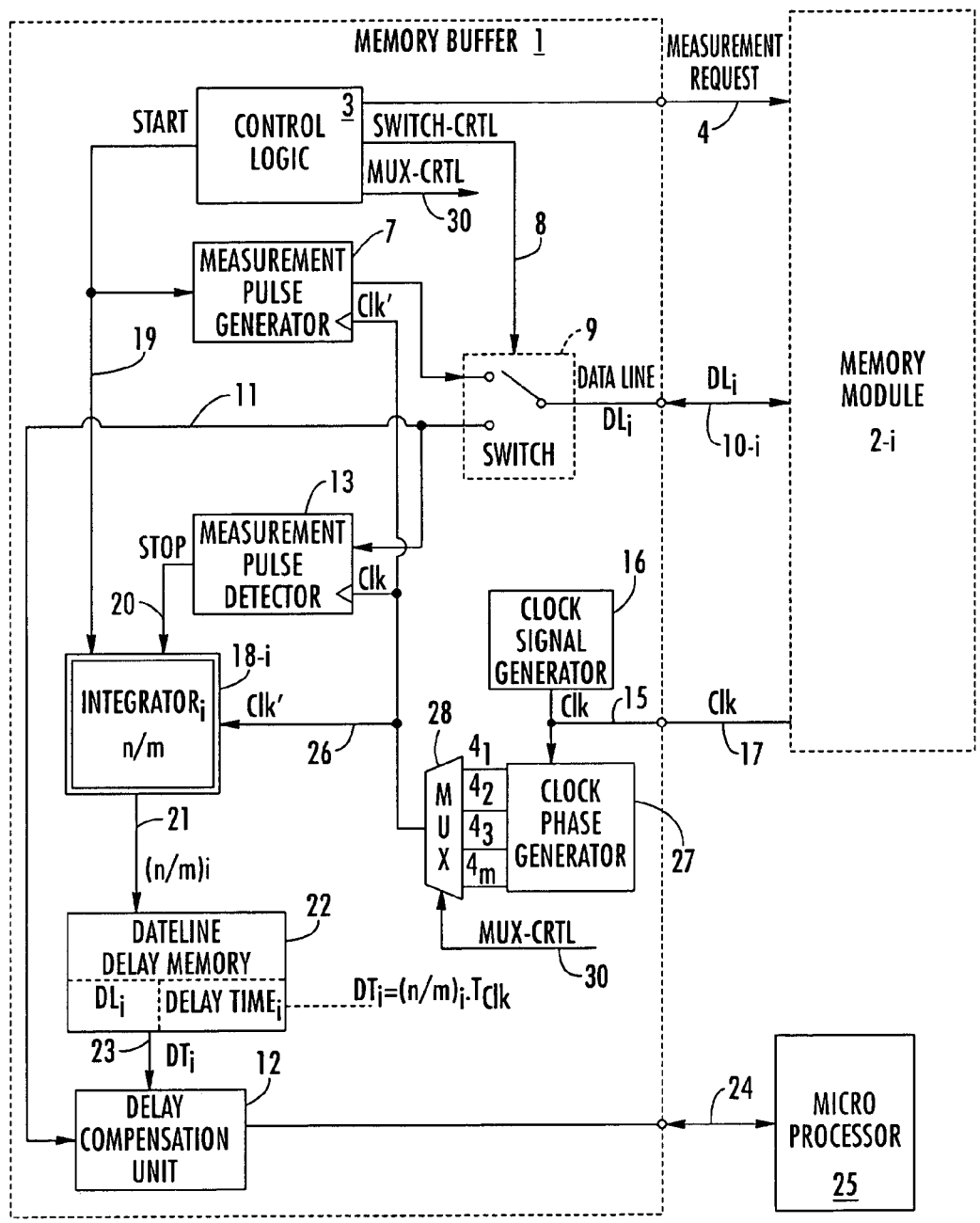
FIG. 5 shows a third embodiment of the memory buffer according to the present invention.

In the embodiment as shown in FIG. 4 the integrator circuit 18 measures the delay time for a transmission and a retransmission of a measurement pulse over the bi-directional data line 10-*i*. Accordingly the integration circuit 18 stores half the measured time in the signal delay memory 22 corresponding to a uni-directional read access to the memory module 2-*i* wherein the data stored in the memory module 2 is read via data line 10-*i*, i.e. the data has to be transmitted only in one direction. FIG. 5 shows a third embodiment of the memory buffer 1 according to the present invention. The integration circuit 18-*i* provided for the corresponding data line 10-*i* receives a phase adjusted clock signals CLK' over an internal clock line 26 within the memory buffer 1. The clock signal generator 16 and the memory buffer 1 generates a clock signal as shown in FIG. 6*a*. The phase adjusted clock signal CLK' is supplied to the integration circuit 18-*i* as shown in FIG. 6*b*. The phase adjusted clock signal CLK' comprises a phase delay $\phi_i$ for providing a finer time grid or time raster.

Figure 7A:
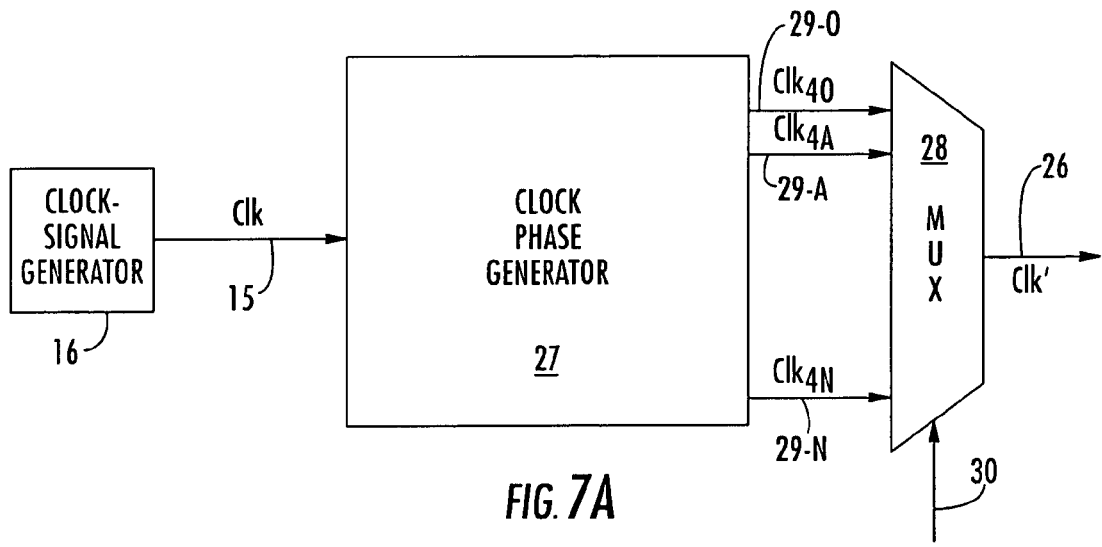
FIGS. 7a, 7b shows the generation of a phase adjusted timing signal according to the present invention.
Figure 7B:
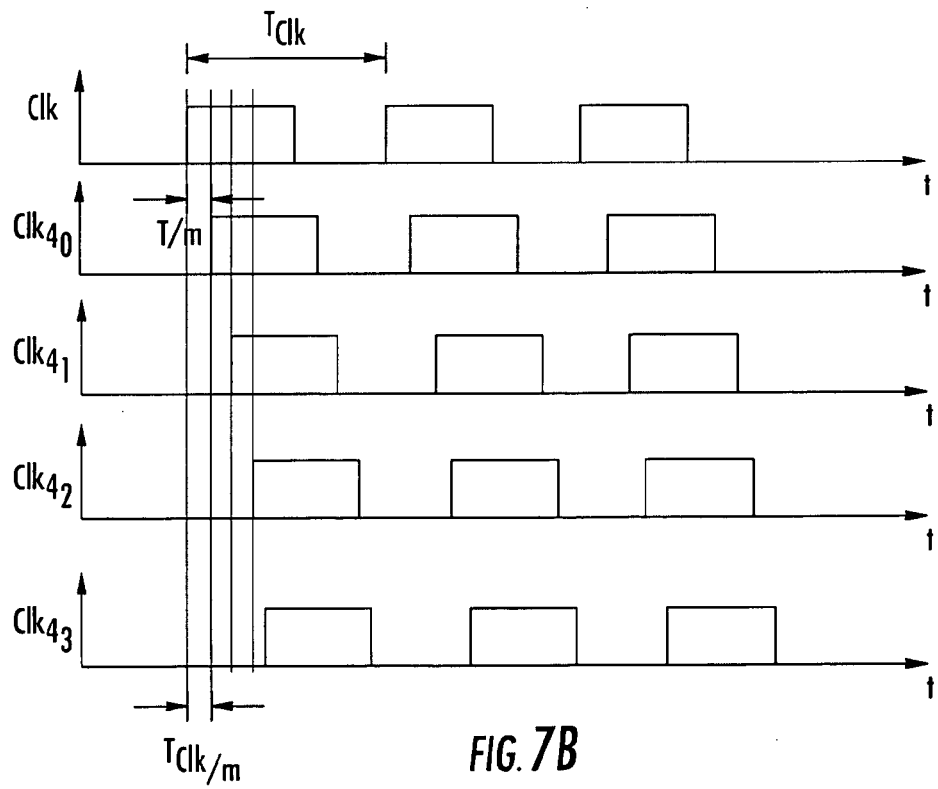

The phase adjusted clock signal CLK' is generated by means of a clock phase generator 27 and a multiplexer 28 as shown in FIGS. 5 and 7*a*. The clock phase generator 27 receives the clock signal CLK from the clock signal generator 16 and outputs N delayed clock signals having a phase delay $T_{CLK}/m$ (m being an integer number). The delayed clock signals are provided via lines 29-*i* to the inputs of the multiplexer 28. The multiplexer 28 is controlled via control line 30 of the control logic 3 which switches one of the phase delayed clock signals $CLK\phi_i$ through to the input of the integration circuit 18-*i*.

Figure 8A:
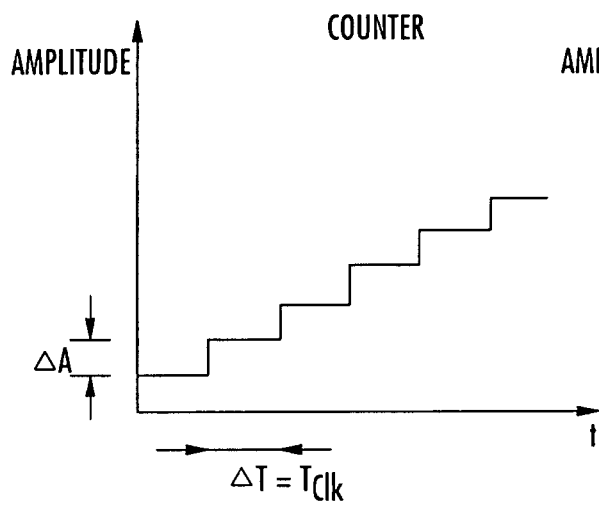
FIGS. 8a, 8b shows the operation of the integration circuit according to the present invention in comparison to a conventional counter.
Figure 8B:
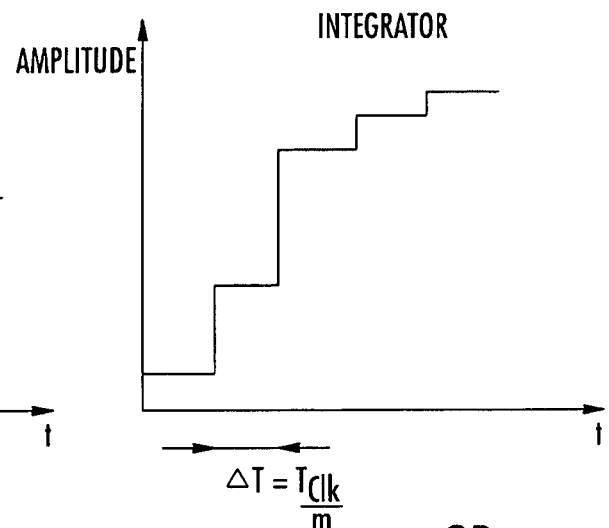

FIG. 8 shows the operation of the integration circuit 18-*i* according to the present invention in comparison to a conventional counter. A conventional counter is both time discrete and amplitude discrete. In contrast an integration circuit as provided within the memory buffer 1 according to the present invention is time discrete but provides a continuous amplitude range.

Figure 9A:
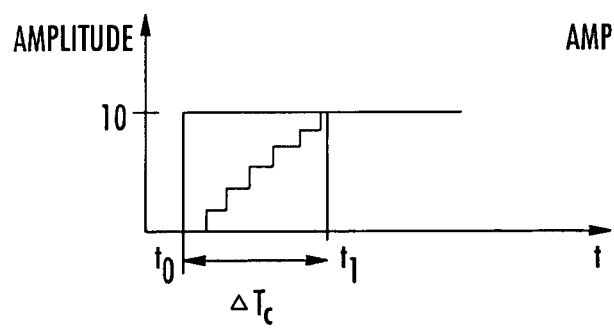
FIGS. 9a, 9b shows step responses of an integration circuit according to the present invention in comparison to a conventional counter.
Figure 9B:
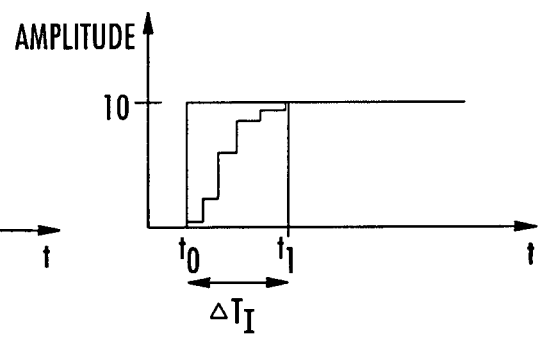

FIG. 9*a* shows the step response of a conventional counter and FIG. 9*b* shows the step response of an integration circuit 18-*i* as provided in the memory buffer 1 according to the present invention. Whereas the counter approximates in a step function the amplitude $A_0$ the step response of the integrator approximates the amplitude $A_0$ with continuous amplitude values sooner than the counter shown in FIG. 9*a* ($\Delta T_i < \Delta T_c$). The integration circuit 18-*i* provided for each signal 10-*i* integrates time fractions of the clock period $T_{CLK}$ of the clock signal CLK in a very fine time grid ($T_{CLK}/m$). The measured signal line delay $(n/m)_i \cdot T_{CLK}$ of the delay line 10-*i* is memorized in the signal line delay memory 22.

In the following the operation of the memory buffer 1 according to the present invention is described with respect to FIGS. 10 to 12.

Once the voltage supply for the DIMM memory has been produced, that is to say after the system has been switched on, there is sufficient time to carry out an initialization routine. Since the described problem results from the physical configuration, that is to say the extent, of the arrangement, the effect which needs to be compensated for is a static effect. Furthermore, all the signal sources and sinks are located on the same DIMM module, so that there is no need to take into account any external influences.

Figure 10:
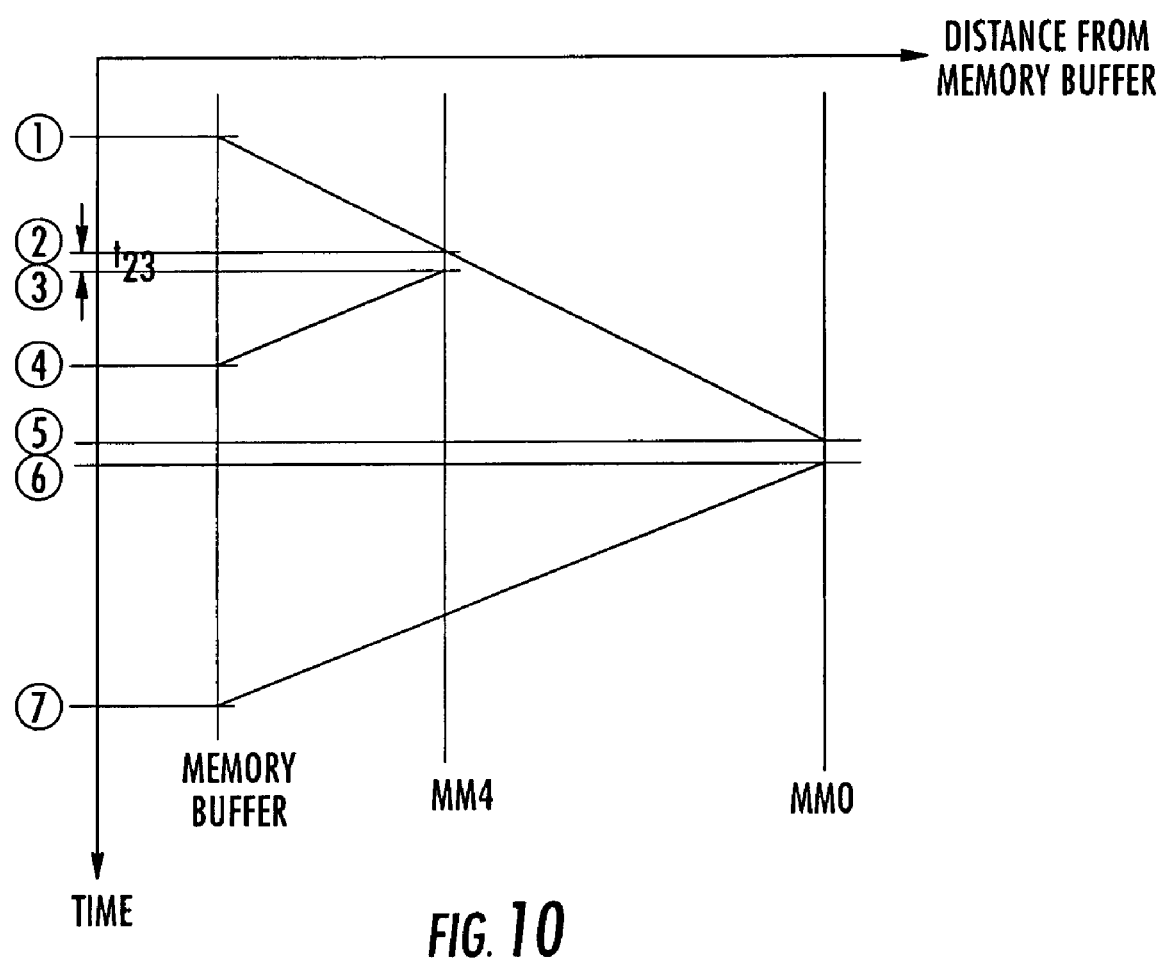
FIG. 10 shows a timing diagram of a time delay measuring procedure according to the present invention.
Figure 11:
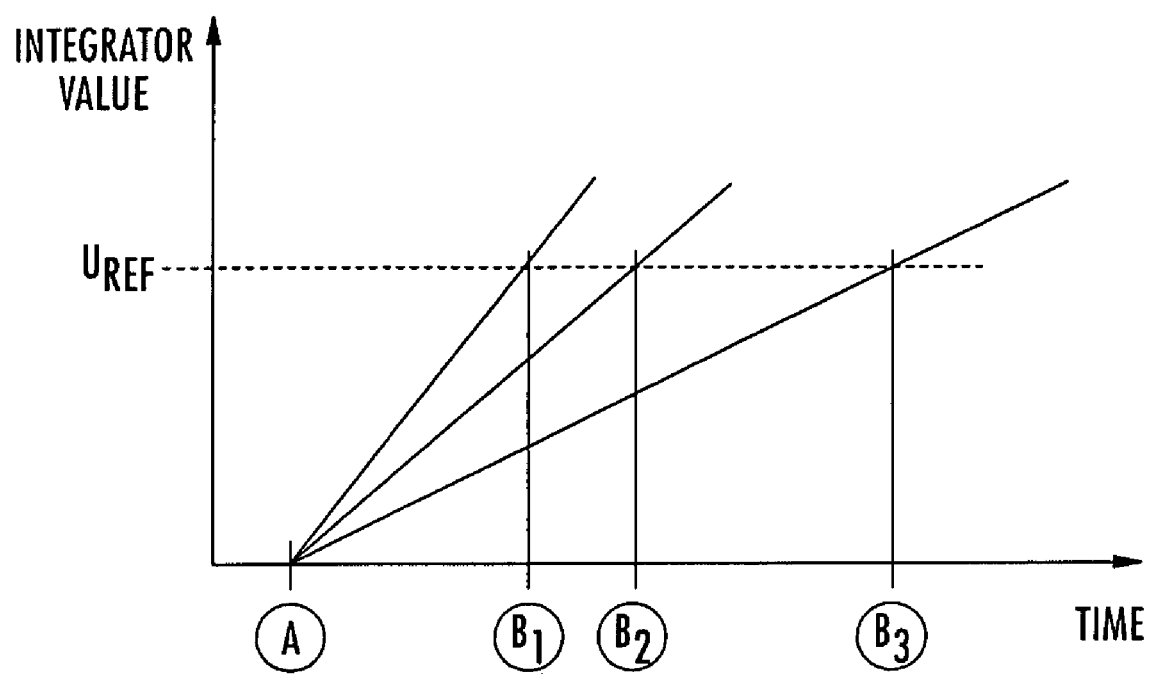
FIG. 11 shows a timing diagram of a integration circuit according to the present invention.
Figure 12:
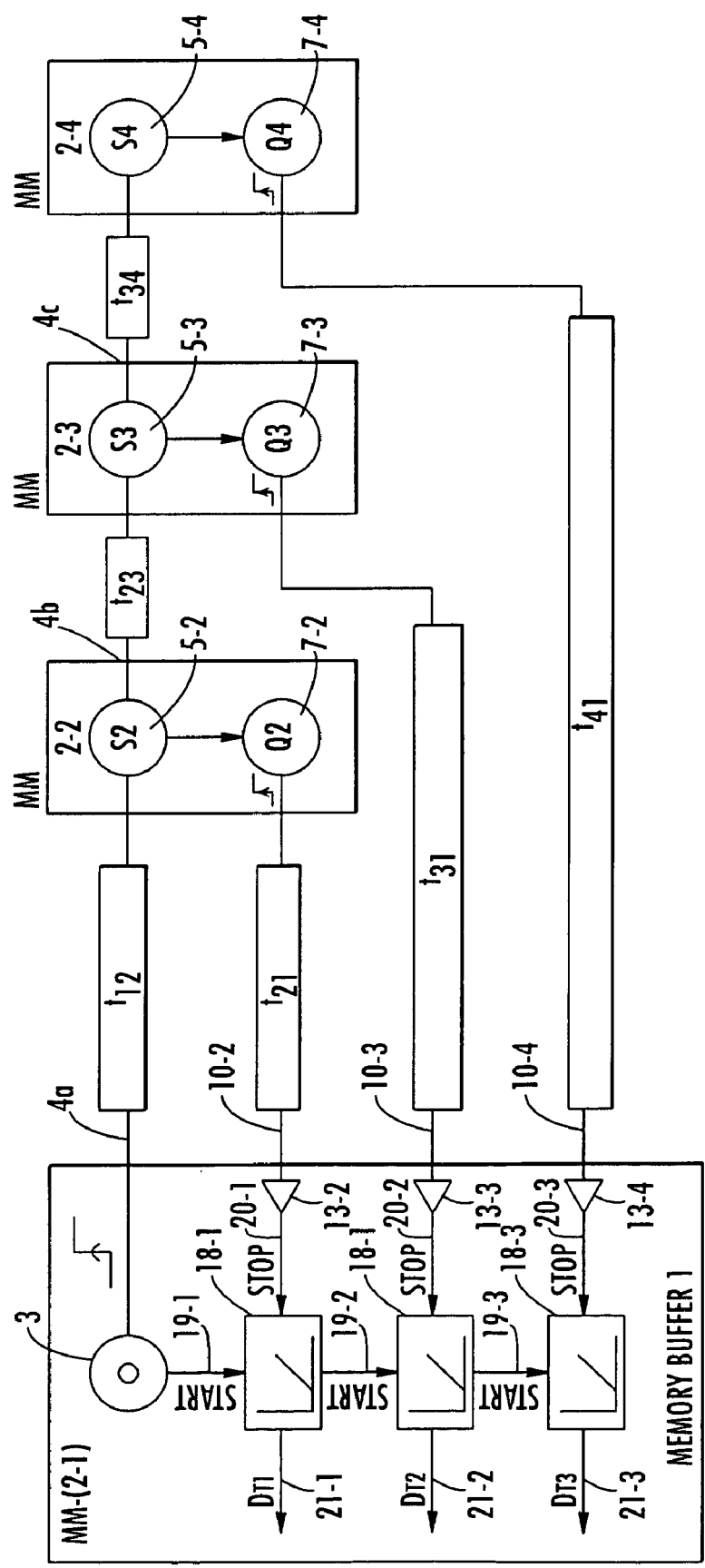
FIG. 12 shows a schematic for illustrating the delay time measuring method according to the present invention.

The delay time compensation takes place as an iterative process, which will now be described in the following text and is illustrated in FIGS. 10 to 12.

Once all the dynamic circuit parts of the memory buffer 1 (HUB) and of the memory modules 2-*i* have stabilized, for example PLL, DLL etc., the memory buffer (HUB) sends a defined command to the memory modules 2-*i*. This is done at the time t1. The electrical signal for this measurement start command propagates along the DIMM module until it reaches the next receiver, in this case 2-2 at the time t2. Since the DIMM is in an initialization routine and is not in the normal operating mode, the dead time (difference between t2 and t3) can be kept very short. Furthermore, there is no need to take any further account of the dead time since it is identical for all memory modules 2-*i* and only relative delay time differences are relevant. The next memory module responds at the time t3 with a unit jump, that is to say it changes the data bus bits at all of its outputs from 0 (low) to 1 (high). This signal transition now once again propagates along the data lines from the memory module until this signal transition is received at the memory buffer at the time t4. At the time t5, the initialization command sent at time t1 also reaches the memory module which is furthest away (in this case memory module 2-4). At the time t6, this then also changes its data bus bits from 0 (low) to 1 (high). At the time t7, the memory buffer 1 (HUB) receives this signal change in the data bits of the transmitter 2-4 which is the furthest away.

So far, no significant information has yet been obtained about the delay time of the individual data bits. However, this is achieved if, at the time t1, not only is the command sent but also at the same time a type of "stopwatch" is started in all the receiving data lines DLs of the memory buffer 1.

This stopwatch is formed according to the present invention by a controllable integrator 18-*i*. FIG. 11 shows the essential details of an integrator 18-*i* provided within a memory buffer according to the present invention. One important feature of the integrator 18-*i* is a reference value. As soon as the integrator 18-*i* has exceeded this reference value, an indication is produced, that is to say an output signal changes its state. However, the most important feature of the integrator 18-*i* is that the gradients can be controlled by a binary word. The integrator 18-*i* is started at the time A, and it exceeds the reference value at the time B. The time difference between A and B depends on the gradient of the integrator 18-*i*. The shallower the gradient, the greater is the time period before the reference value is exceeded. This is illustrated by the times $B_1$, $B_2$ and $B_3$.

In order to understand the principle of operation of the measurement method according to the present invention, a brief description is given of what the initialization routine is intended to achieve. A time variable $DT_i$ (Delay time) must be determined for each data line 10-*i* between the memory buffer 1 and the connected memory module 2-*i*, in order to compensate for the different delay times for further processing. For this purpose, each data line 10-*i* of the memory buffer 1 has its own controllable integrator 18-*i* as described above, and as illustrated in FIG. 11. As soon as the command is sent to the memory module 2-*i*, that is to say at the time t1 in FIG. 10, each data line 10-*i* starts its own integrator 18-*i*. As soon as the associated data bit changes from 0 to 1, the integrator 18-*i* is stopped. If the reference value had already been exceeded at this stopping time, the data line 18-*i* was slower than assumed and the measurement is repeated.

However, this is now done with a shallower integrator gradient. With one integrator gradient, the data signal is now received at an earlier time than the integrator 18-*i* requires to exceed the reference value. Since the gradient of the integrator 18-*i* is controlled by a binary word, this binary word at the same time represents a measure of the delay time DT on the data line 10-$i$. This process is now repeated until all the data lines 10-$i$ have been measured and a specific binary delay time word has been determined for all of the data lines 10-$i$. This value is now used to additionally delay all the data lines such that the data within the memory buffer 1 is subject to a standard time delay, and the time consistency is ensured once again.

FIG. 12 shows a outline overview of the delay time measurement method according to one embodiment of the present invention. The signal source Q in the memory buffer on the left sends a command to the command and address bus (CA) to carry out the delay time measurement. This is indicated only by a sudden signal change. At the same time, this event indicates the start condition for all the controllable integrators 18-$i$ in the data line circuits of the memory buffer 1. The different delay times to the individual sinks Si are represented by the line elements and are illustrated with delay times $t_{12}$, $t_{23}$ etc. The sinks Si cause the sources Qi in the addressed memory modules 2-$i$ to send a measurement pulse. This is once again perceived by the data lines 10-$i$ and indicates the stop condition for the integration, and initiates a check as to whether the integrator 18-$i$ has already exceeded the reference value. All the delay times $Dt_i$ can thus be determined by iteration.

Figure 13:
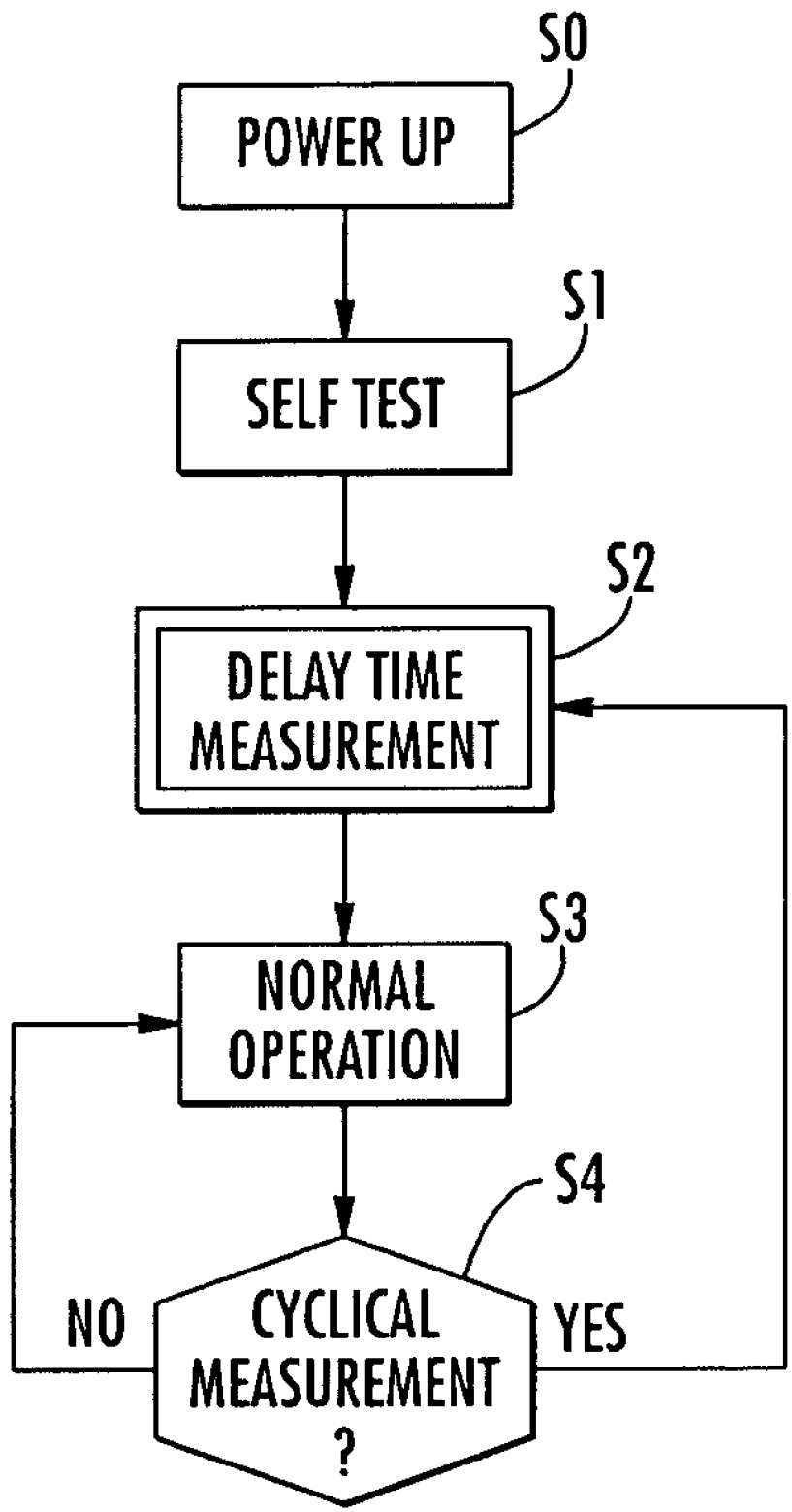
FIG. 13 shows a flow-chart for delay time measurement procedure according to the present invention.

FIG. 13 shows the time sequence for the delay time measurement according to the present invention. Once the supply voltage has been applied in step SØ (power up), all the modules 2-$i$ start to carry out their self tests in step S1. If these have been successful, the memory modules 2-$i$ enter the initialization routine for the delay time measurement according to the present invention in step S2. Once the delay time measurement has been carried out and the associated compensation values have been determined, the memory modules 2-$i$ can change to the normal operating mode in step S3. In a preferred embodiment the delay time measurement is not only performed during initialization but in cyclical manner every predetermined time (step S4).

Advantages of the delay time measurement method according to the present invention are:
  Simple implementation
  Feasibility both with analog and mixed signal methods as well as with digital circuit concepts
  Small area and low power requirement
  No need for high-frequency clock signals for performing counting
  Capability for single-ended compensation (a determined value of the de-skew can be used in inverted forms as a pre-skew, which considerably simplifies the circuit complexity of the memory modules 2-$i$).

It is of importance that the measurement method according to the present invention is a flexible method. At the time when the circuit parts involved are produced only the orders of magnitude of the delay time DT to be compensated for are required. There is no need for detailed analysis of the physical design. The delay time measurement method is sufficiently flexible to be adapted to the conditions after assembly. It is also a fast and simple method which can be carried out during the switch-on phase (boot time) without this resulting in any need to accept regular reductions in performance.

Since each data line 10-$i$ has its own controllable integrator 18-$i$ the concept can be extended to any desired number of data lines 10-$i$. Furthermore, this allows parallel processing, that is to say all the data lines 10-$i$ are processed at the same time. There is no need to process one data line 10-$i$ after the other. In the case of a plurality of data lines 10-$i$ (for example 72 bits on one DIMM), this is the major reason why the method according to the present invention can be carried out so quickly.

The control logic 3 for the individual integrators 18-$i$, which checks whether the last delay time measurement was successful, is in a first embodiment implemented centrally. This means that the complexity for these circuit parts is required only once. However, with present semi-conductor technologies, this represents only a minor advantage. On the other hand, each data line includes in an alternative embodiment its own control logic 3-$i$ so that it can act completely individually. This may be of interest for data transmissions in which the data bus width is intended to be enlarged dynamically in order successively to increase the total data throughput, and to match it to the requirements.

Each integrator 18-$i$ is started at the same time that the delay time command or measurement start command is transmitted, so that there is no need for complex detection methods to determine the start time.

The value which represents the delay time $DT_i$ has not to be produced by high-frequency counting pulses but is available simply from the gradient of the integrator 18-$i$. The delay time measurement merely determines whether the previously assumed value, that is to say the instantaneous gradient, is or is not correct. A step-by-step iteration process is used to approach the value at which the delay time measurement is successful.

What is claimed is:

1. A memory buffer for a memory module board which is connected via a plurality of signal lines to a plurality of memory modules mounted on said memory module board having different signal line lengths, wherein the memory buffer comprises for each signal line a corresponding integration circuit for integrating the transmission time of a measurement pulse transmitted via said signal line between said memory buffer and a memory module connected to said signal line, and further wherein the memory buffer comprises a control logic which sends a measurement start command to the memory modules via a control line of a command and address bus.

2. The memory buffer according to claim 1, wherein the signal line is a data line of a bi-directional data bus.

3. The memory buffer according to claim 1, wherein the memory buffer comprises a measurement pulse detector which detects a measurement pulse received via said signal line.

4. The memory buffer according to claim 1, wherein the integration circuit of a signal line is connected to a corresponding measurement pulse detector of said signal line to receive a stop signal when a measurement pulse is detected by said pulse detector.

5. The memory buffer according to claim 1, wherein the memory buffer comprises a signal line delay memory for storing the integrated values of all integration circuits provided within said memory buffer as delay times of the corresponding signal lines.

6. The memory buffer according to claim 1, wherein the memory buffer comprises a delay compensation unit which compensates the delay times of the signal lines depending on the delay times stored in said signal line delay memory to provide an equal standard time delay for all signal lines of said memory buffer.

7. The memory buffer according to claim 1, wherein the integration circuits are supplied with a phase adjusted clock signal generated by a clock phase generator to integrate time fractions of a clock period of a clock signal generated by a clock signal generator provided within said memory buffer.

8. The memory buffer according to claim 1, wherein the memory modules are DRAMs.

9. A memory buffer for a memory module board which is connected via a plurality of signal lines to a plurality of memory modules mounted on said memory module board having different signal line lengths, wherein the memory buffer comprises for each signal line a corresponding integration circuit for integrating the transmission time of a measurement pulse transmitted via said signal line between said memory buffer and a memory module connected to said signal line, further wherein the memory buffer comprises a control logic which sends a measurement start command to the memory modules via a control line of a command and address bus, and further wherein each integration circuit is connected to the control logic to receive a start signal when the measurement start command is sent to the memory modules.

10. A memory buffer for a memory module board which is connected via a plurality of signal lines to a plurality of memory modules mounted on said memory module board having different signal line lengths, wherein the memory buffer comprises for each signal line a corresponding integration circuit for integrating the transmission time of a measurement pulse transmitted via said signal line between said memory buffer and a memory module connected to said signal line, further wherein the memory buffer comprises a control logic which sends a measurement start command to the memory modules via a control line of a command and address bus, and further wherein the memory buffer comprises a measurement pulse generator which transmits a measurement pulse via the signal line when the control logic sends a measurement start command to the memory modules.

11. A memory buffer for a memory module board which is connected via a plurality of signal lines to a plurality of memory modules mounted on said memory module board having different signal line lengths, wherein the memory buffer comprises for each signal line a corresponding integration circuit for integrating the transmission time of a measurement pulse transmitted via said signal line between said memory buffer and a memory module connected to said signal line, further wherein the memory buffer comprises a delay compensation unit which compensates the delay times of the signal lines depending on the delay times stored in said signal line delay memory to provide an equal standard time delay for all signal lines of said memory buffer, and further wherein the delay compensation unit is connected via signal lines to a microcontroller mounted on a motherboard.

* * * * *